United States Patent
Arai et al.

(10) Patent No.: US 7,687,375 B2
(45) Date of Patent: Mar. 30, 2010

(54) LAMINATION DEVICE MANUFACTURING METHOD

(75) Inventors: Kazuhisa Arai, Ota-Ku (JP); Akihito Kawai, Ota-ku (JP)

(73) Assignee: Disco Corporation, Tokyo (JP)

(*) Notice: Subject to any disclaimer, the term of this patent is extended or adjusted under 35 U.S.C. 154(b) by 0 days.

(21) Appl. No.: 12/345,222

(22) Filed: Dec. 29, 2008

(65) Prior Publication Data
US 2009/0181519 A1 Jul. 16, 2009

(30) Foreign Application Priority Data
Jan. 11, 2008 (JP) .............................. 2008-004444

(51) Int. Cl.
*H01L 21/00* (2006.01)
(52) U.S. Cl. ...................... 438/462; 438/460
(58) Field of Classification Search .......... 438/460–464
See application file for complete search history.

(56) References Cited

U.S. PATENT DOCUMENTS

2005/0070074 A1* 3/2005 Priewasser .................. 438/462

FOREIGN PATENT DOCUMENTS

JP    A 60-206058    10/1985

\* cited by examiner

*Primary Examiner*—Richard A. Booth
(74) *Attorney, Agent, or Firm*—Greer, Burns & Crain, Ltd.

(57) ABSTRACT

A lamination device manufacturing method for manufacturing a lamination device using a reinforced wafer formed with an annular reinforced portion, includes a wafer lamination step in which a rear surface of the reinforced wafer corresponding to the device area is faced to and joined to the front surface of an underlying wafer with corresponding streets aligned with each other, thus forming a lamination wafer; an electrode connection step in which a via-hole is formed at a position where an electrode is formed in each of the devices of the reinforced wafer constituting part of the lamination wafer, so as to reach a corresponding electrode formed in each of the devices of the underlying wafer, and the via-hole is filled with a conductive material to connect the electrodes; and a division step in which after the electrode connection step is executed, the lamination wafer is cut along the streets and divided into individual lamination devices.

4 Claims, 15 Drawing Sheets

LAMINATION DEVICE MANUFACTURING METHOD

BACKGROUND OF THE INVENTION

1. Field of the Invention

The present invention relates to a manufacturing method of forming a lamination device by lamination of semiconductor devices.

2. Description of the Related Art

In a semiconductor device manufacturing step, the front surface of a generally disk-like semiconductor wafer is sectioned into a plurality of areas by predetermined dividing lines called streets arranged in a lattice pattern and devices such as ICs, LSIs, or the like are formed in the areas thus sectioned. In addition, the semiconductor wafer is cut along the streets to divide the areas formed with the devices for manufacturing individual devices.

In order to enhance the function of the semiconductor device, lamination devices or stacked devices in which individual devices are laminated or stacked one on another are put to practical use. A method of manufacturing a lamination device in which individual devices are laminated one on another is disclosed by Japanese Patent Laid-open No. Sho 60-206058. In the lamination device manufacturing method disclosed by this laid-open bulletin, a wafer is ground from the rear surface thereof to have a thickness of about 200 μm. A front surface of each of the plurality of wafers whose rear surfaces were ground as described above is faced to and joined to a rear surface of another wafer with corresponding streets aligned with each other to form a lamination wafer. Thereafter, the lamination wafer is cut along the streets by a dicing device such as a cutting device or the like to form lamination devices.

In this way, if five wafers are laminated, since a wafer has a thickness of about 200 μm, the lamination device has a thickness of 1000 μm or more. In recent years, electric equipment has highly been demanded to be reduced in weight and in size. A wafer may be formed to have a thickness of 100 μm or less. In such a case, even if ten or more wafers are laminated, the lamination wafer can be made to have a thickness of 1000 μm or less, which can further enhance the function of the lamination device. However, if the wafer is formed to have a thickness of 100 μm or less, it significantly lowers in rigidity to become fragile. This poses a problem in that it is difficult to handle, such as convey and laminate, the wafer.

On the other hand, Japanese Patent Laid-open No. 2007-19461 discloses a wafer that can ensure rigidity even if it is reduced in thickness. The wafer disclosed in this laid-open bulletin includes a device area formed with a plurality of devices and an outer circumferential surrounding area surrounding the device area. In addition, the wafer is ground from the rear surface corresponding to the device area so that the device area may have a predetermined thickness and the outer circumferential surrounding area of the rear surface of the wafer is left to form an annular reinforced portion.

SUMMARY OF THE INVENTION

Accordingly, it is an object of the present invention to provide a lamination device manufacturing method that can provide a lamination device thin in the entire thickness by laminating wafers without breakage even if the wafers are each made thin in thickness.

In accordance with an aspect of the present invention, there is provided a lamination device manufacturing method for manufacturing a lamination device using a reinforced wafer, in which the reinforced wafer is sectioned into a plurality of areas by streets arranged on a front surface in a lattice pattern and includes a device area formed with devices in the areas thus sectioned and an outer circumferential redundant or residue area surrounding the device area, an area of an rear surface corresponding to the device area is ground so that the device area may be formed to have a predetermined thickness and an area corresponding to the outer circumferential redundant area may be left to form an annular reinforced portion. The method includes: a wafer lamination step in which an underlying wafer having a diameter slightly smaller than an inside diameter of the annular reinforced portion of the reinforced wafer and formed on a front surface with a plurality of streets and of devices corresponding respectively to a plurality of streets and of devices formed in the device area of the reinforced wafer is prepared, and a rear surface of the reinforced wafer corresponding to the device area is faced to and joined to the front surface of the underlying wafer with corresponding streets aligned with each other, thus forming a lamination wafer; an electrode connection step in which a via-hole is formed at a position where an electrode is formed in each of the devices of the reinforced wafer constituting part of the lamination wafer, so as to reach a corresponding electrode formed in each of the devices of the underlying wafer, and the via-hole is filled with a conductive material to connect the electrodes; and a division step in which after the electrode connection step is executed, the lamination wafer is cut along the streets and divided into individual lamination devices.

Preferably, before the execution of the division step, the following steps are executed: an annular reinforced portion removing step in which an annular reinforced portion is removed so that the reinforced wafer constituting part of the lamination wafer may have a diameter slightly smaller than the inside diameter of the annular reinforced portion; a second wafer lamination step in which a rear surface, of a reinforced wafer to be next laminated, corresponding to a device area is faced to and joined to the front surface of the reinforced wafer of the lamination wafer subjected to the annular reinforced portion removing step with corresponding streets aligned with each other; and a second electrode connection step in which a via-hole is formed at a position where an electrode formed in each of devices of the upper reinforced wafer laminated by the second wafer lamination step, so as to reach a corresponding electrode formed in each of devices of the lower reinforced wafer, and is filled with a conductive material for connecting the electrodes.

The annular reinforced portion removing step, the second wafer lamination step, and the second electrode connection step described above are repeatedly executed to form a multi-layered lamination wafer.

Preferably, before execution of the division step, an underlying wafer grinding step is executed in which an underlying wafer is ground from a rear surface to be formed to have a predetermined thickness.

According to the present invention, the lamination wafer is formed by laminating the device area of the reinforced wafer which includes the device area formed with the devices and the outer circumferential redundant area surrounding the device area and in which an area of an rear surface corresponding to the device area is ground so that the device area may be formed to have a predetermined thickness and an area corresponding to the outer circumferential redundant area may be left to form an annular reinforced portion. Although the device area is reduced in thickness, since the configuration of the reinforced wafer is maintained, the wafer can be laminated without breakage. In this way, since the reinforced wafer can be reduced in thickness in the device area, even if the wafers are multi-layered, the lamination device thin in the entire thickness can be provided.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments of a lamination device manufacturing method according to the present invention will hereinafter be described in detail with reference to the accompanying drawings. A description is first given of a reinforced wafer used in the lamination device manufacturing method according to the present invention.

Figure 1:
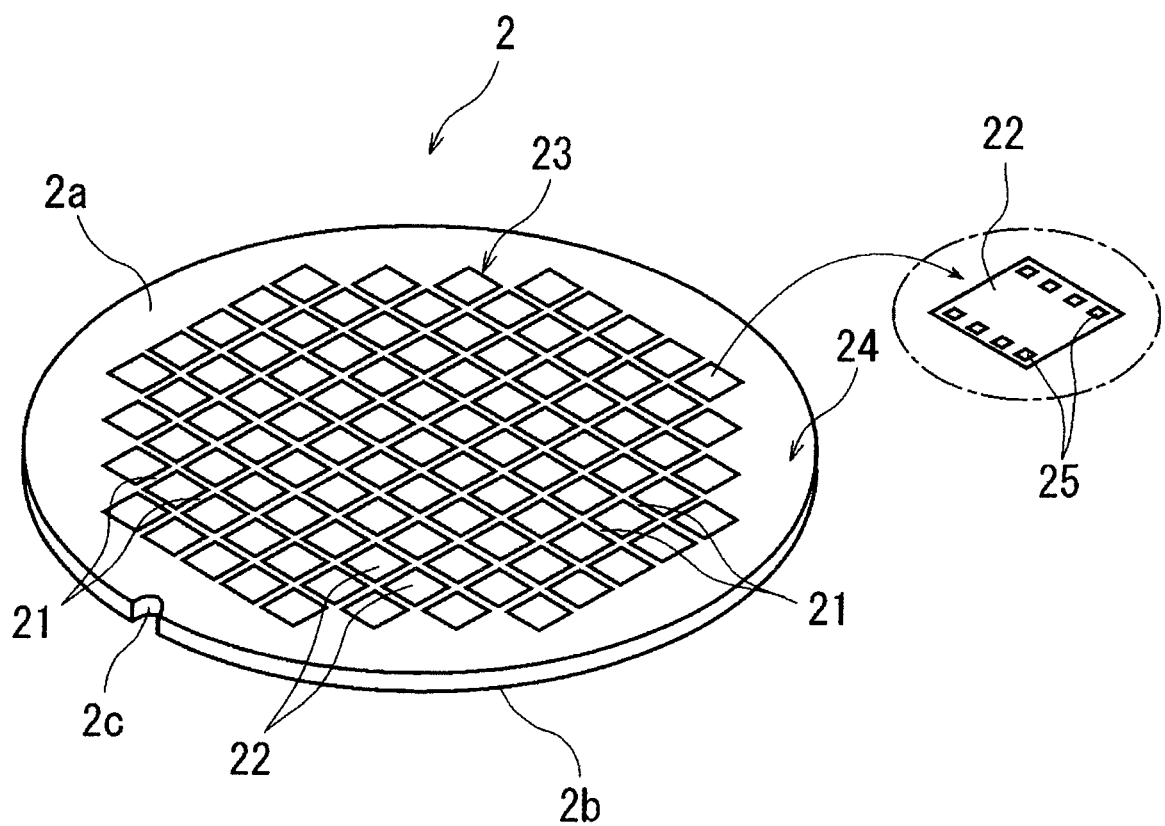
FIG. 1 is a perspective view of a semiconductor wafer as a wafer used in a lamination device manufacturing method according to the present invention.

FIG. 1 is a perspective view of a semiconductor wafer as a wafer to form a reinforced wafer used in the lamination device manufacturing method according to the present invention. The semiconductor wafer 2 shown in FIG. 1 is made of a silicon wafer, for example, having a diameter of 200 mm and a thickness of 350 μm. A front surface 2a of the semiconductor wafer 2 is formed with a plurality of streets 21 in a lattice pattern and with devices 22 such as ICs, LSIs or the like in a plurality of areas sectioned by the streets 21. The semiconductor wafer 2 formed as mentioned above includes a device area 23 formed with the devices 22 and an outer circumferential redundant area 24 surrounding the device area 23. Incidentally, each of the devices 22 is formed with a plurality of electrodes 25 on a front surface thereof. In addition, the semiconductor wafer 2 is formed on the outer circumference with a notch 2c indicating the crystal orientation of the silicon wafer.

Figure 2:
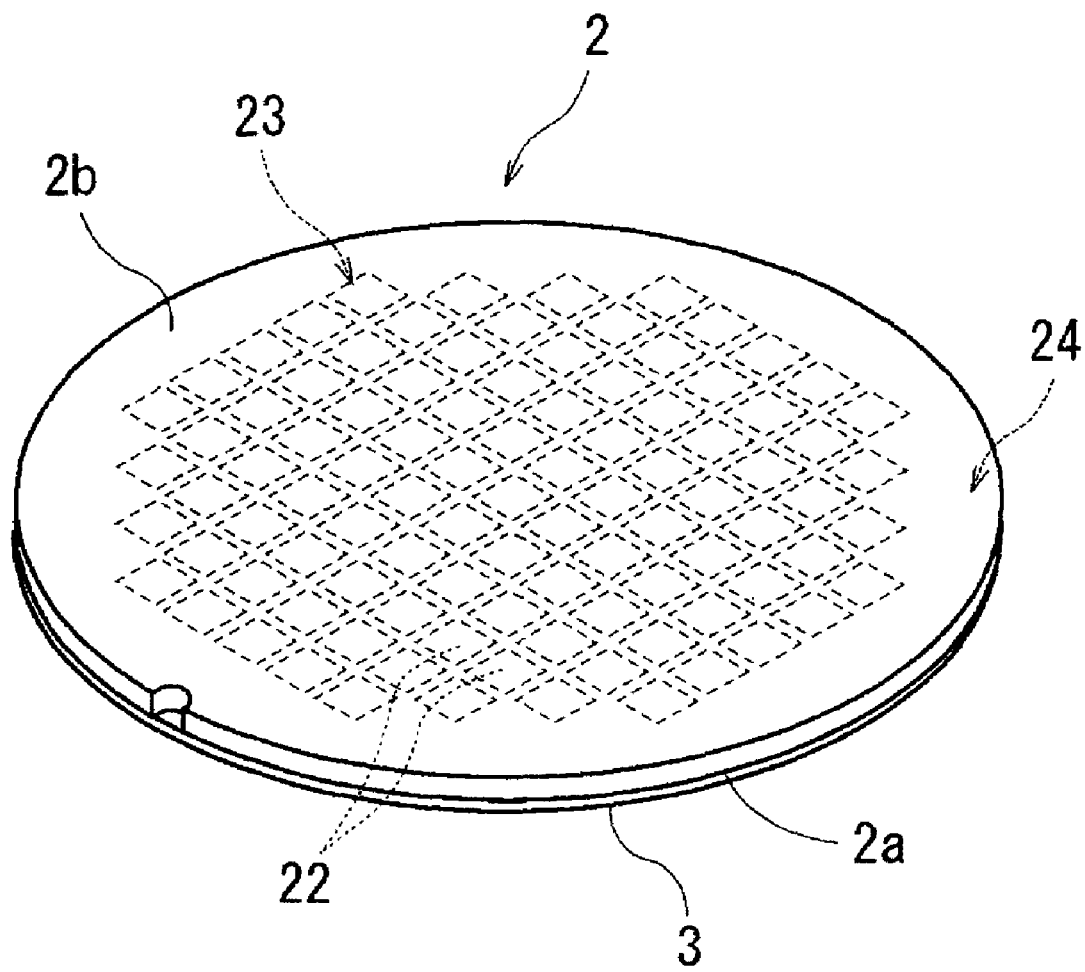
FIG. 2 is a perspective view illustrating a state where a protection member is affixed to the front surface of the semiconductor wafer shown in FIG. 1.

A reinforced wafer is produced as below. The rear surface of the semiconductor wafer 2 shown in FIG. 1 is ground at an area corresponding to the device area 23 so that the device area 23 may have a predetermined thickness. In addition, the rear surface of the semiconductor wafer 2 is provided with an annular reinforced portion at an area corresponding to the outer circumferential redundant area 24. To form such a reinforced wafer, a protection member 3 is first affixed to the front surface 2a of the semiconductor wafer 2 as shown in FIG. 2 (the protection member affixing step). Accordingly, the rear surface 2b of the semiconductor wafer 2 is exposed.

After the protection member affixing step is executed, an annular reinforced portion forming step is executed as below. The area in the rear surface 2b of the semiconductor wafer 2 corresponding to the semiconductor wafer 2 is ground so that the device area 23 may be formed to have a predetermined thickness. In addition, an area in the rear surface 2b of the semiconductor wafer 2 corresponding to the outer circumferential redundant area 24 is left to form an annular reinforced portion. This annular reinforced portion forming step is executed by a grinding device shown in FIG. 3.

Figure 3:
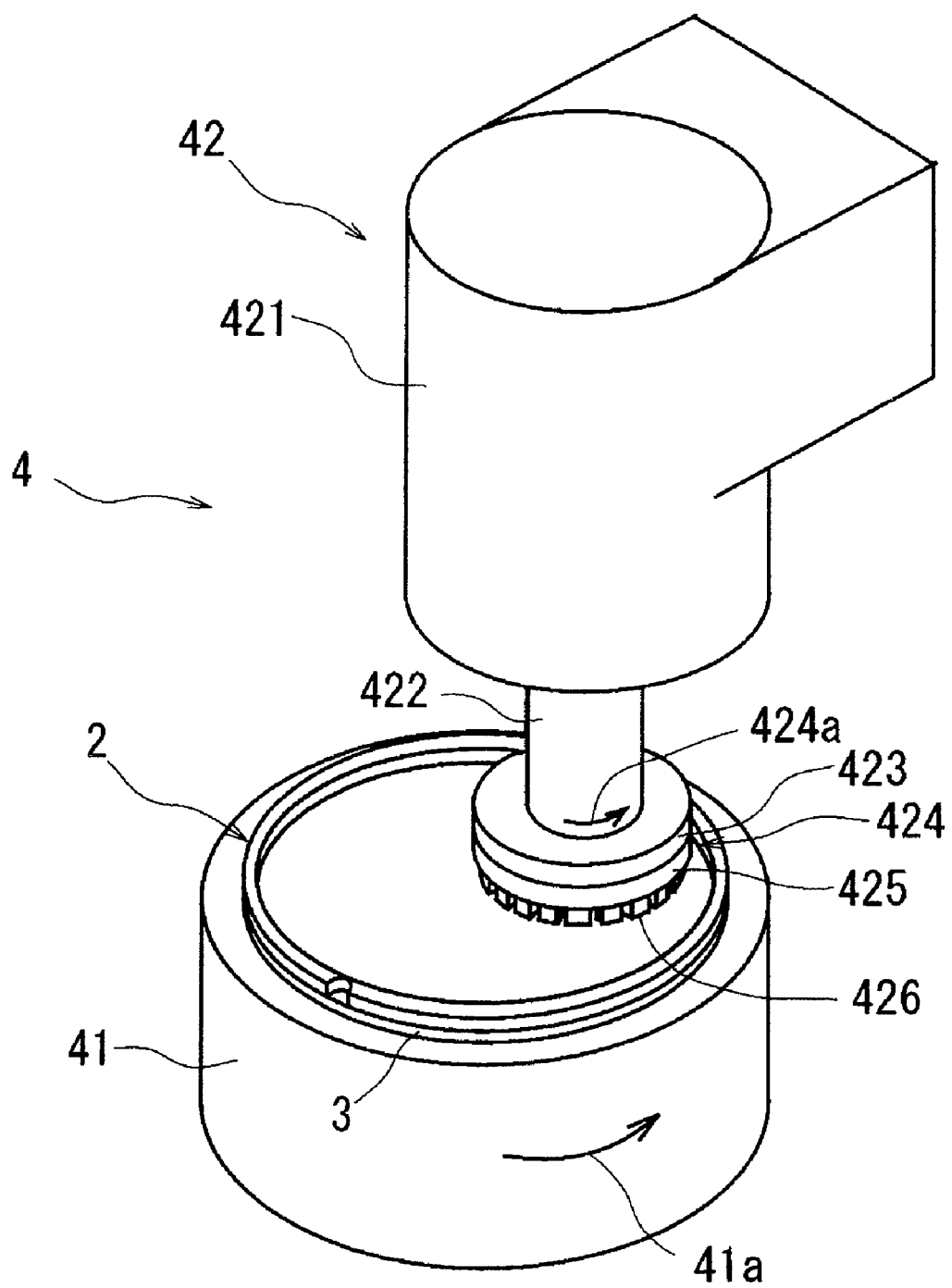
FIG. 3 is a perspective view of a grinding device used to grind the rear surface of the semiconductor wafer shown in FIG. 1 for forming a reinforced wafer.

The grinding device 4 shown in FIG. 3 includes a chuck table 41 adapted to hold a wafer as a workpiece, and grinding means 42 for grinding a process surface of the wafer held by the chuck table 41. The chuck table 41 sucks and holds a wafer onto the upper surface thereof and is rotated in a direction indicated with arrow 41a in FIG. 3. The grinding means 42 includes a spindle housing 421; a rotating spindle 422 rotatably supported by the spindle housing 421 and rotated by a rotational drive mechanism not shown; a mounter 423 mounted to the lower end of the rotating spindle 422; and a grinding wheel 424 attached to the lower surface of the mounter 423. The grinding wheel 424 includes a disk-like base 425 and a grinding stone 426 annularly mounted to the lower surface of the base 425. The base 425 is attached to the lower surface of the mounter 423.

The annular reinforced portion forming step is executed as below by use of the grinding device 4 described above. The semiconductor wafer 2 conveyed by wafer conveying means not shown is placed on the upper surface (the holding surface) of the chuck table 41 with the side of the protection member 3 facing the upper surface of the chuck table 41 and is chucked and held on the chuck table 41. Now, the relationship between the semiconductor wafer 2 held on the chuck table 41 and the annular grinding stone 426 constituting the grinding wheel 424 is described with reference to FIG. 4. The rotational center P1 of the chuck table 41 is eccentric from the rotational center P2 of the annular grinding center 426. The outside diameter of the annular grinding stone 426 is set to a size smaller than the diameter of a border line 26 between the device area 23 and outer circumferential redundant area 25 of the semiconductor wafer 2 and greater than the radius of the border line 26. In addition, the grinding stone 426 is designed to pass through the rotational center P1 (the center of the semiconductor wafer 2) of the chuck table 41.

Figure 4:
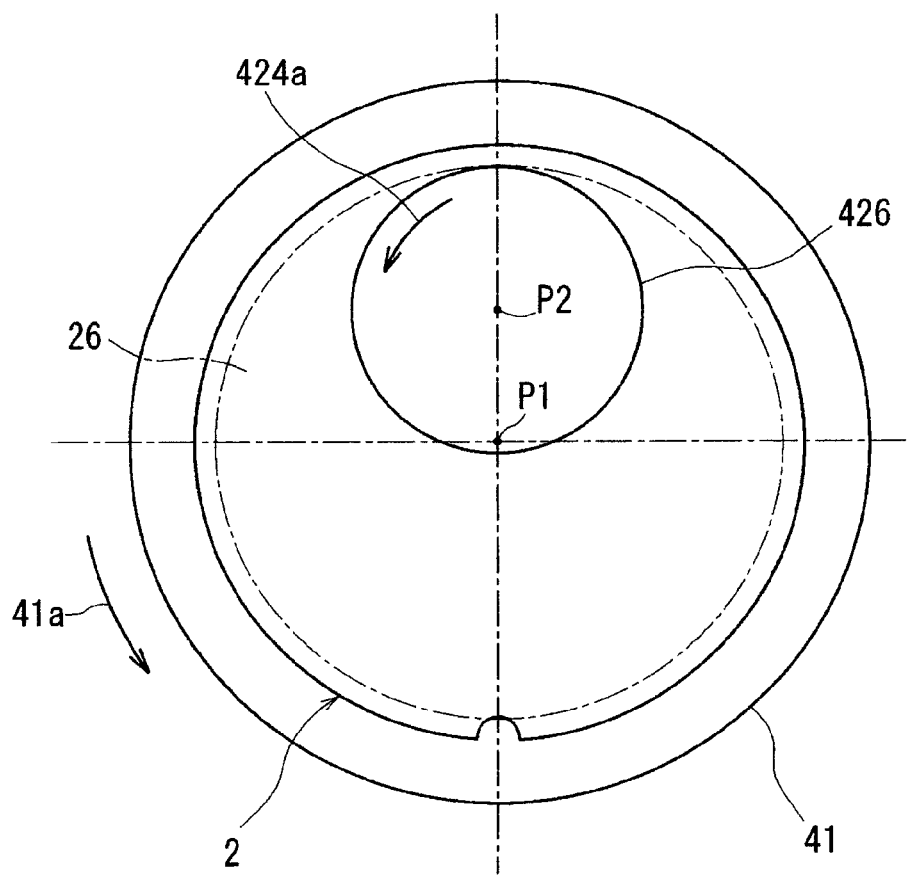
FIG. 4 is a diagram for assistance in explaining an annular reinforced portion forming step executed by the grinding device shown in FIG. 3.
Figure 5:
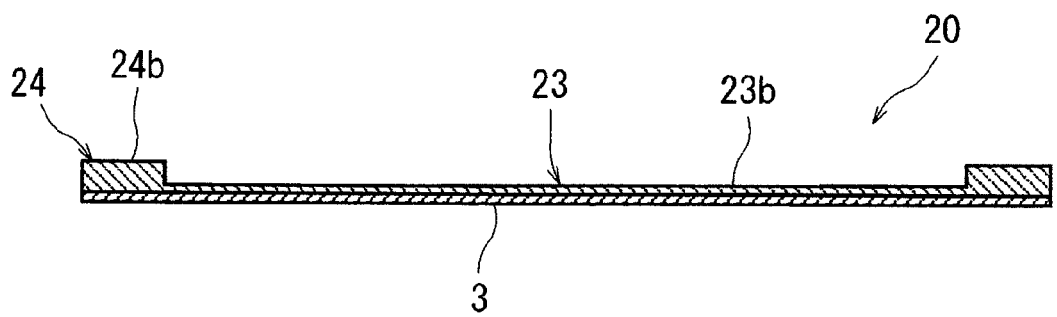
FIG. 5 is a cross-sectional view of a reinforced wafer formed by executing an annular reinforced portion forming step shown in FIG. 4.

Next, as shown in FIGS. 3 and 4, while the chuck table 41 is rotated e.g. at 300 rpm in the direction indicated with arrow 41a, the grinding wheel 424 is rotated e.g. at 6000 rpm in the direction indicated with arrow 424a. In addition, the grinding wheel 424 is moved downward to bring the grinding stone 426 into contact with the rear surface of the semiconductor wafer 2. Then, the grinding wheel 424 is grinding-transferred downward by a predetermined amount at a predetermined grinding-transfer rate. As a result, the area in the rear surface of the semiconductor wafer corresponding to the device area as shown in FIG. 5 is ground and removed to form a circular recessed portion 23b with a predetermined thickness (e.g. 60 μm). In addition, the area corresponding to the outer circumferential redundant area 24 is left to have a thickness of 350 μm to form the annular reinforced portion 24b in the illustrated embodiment. Thus, the reinforced wafer 20 is configured (the annular reinforced portion forming step). Incidentally, the inside diameter of the annular reinforced portion 24b is set to 196 mm in the illustrated embodiment. Although the reinforced wafer 20 formed by executing the annular reinforced portion forming step as described above is ground and removed at the area corresponding to the device area 23 to be formed to have a thickness of as thin as e.g. 60 μm, the annular reinforced portion 24b surrounding the device area 23 is formed. Therefore, the rigidity and strength can be ensured to facilitate handling thereafter.

Figure 6:
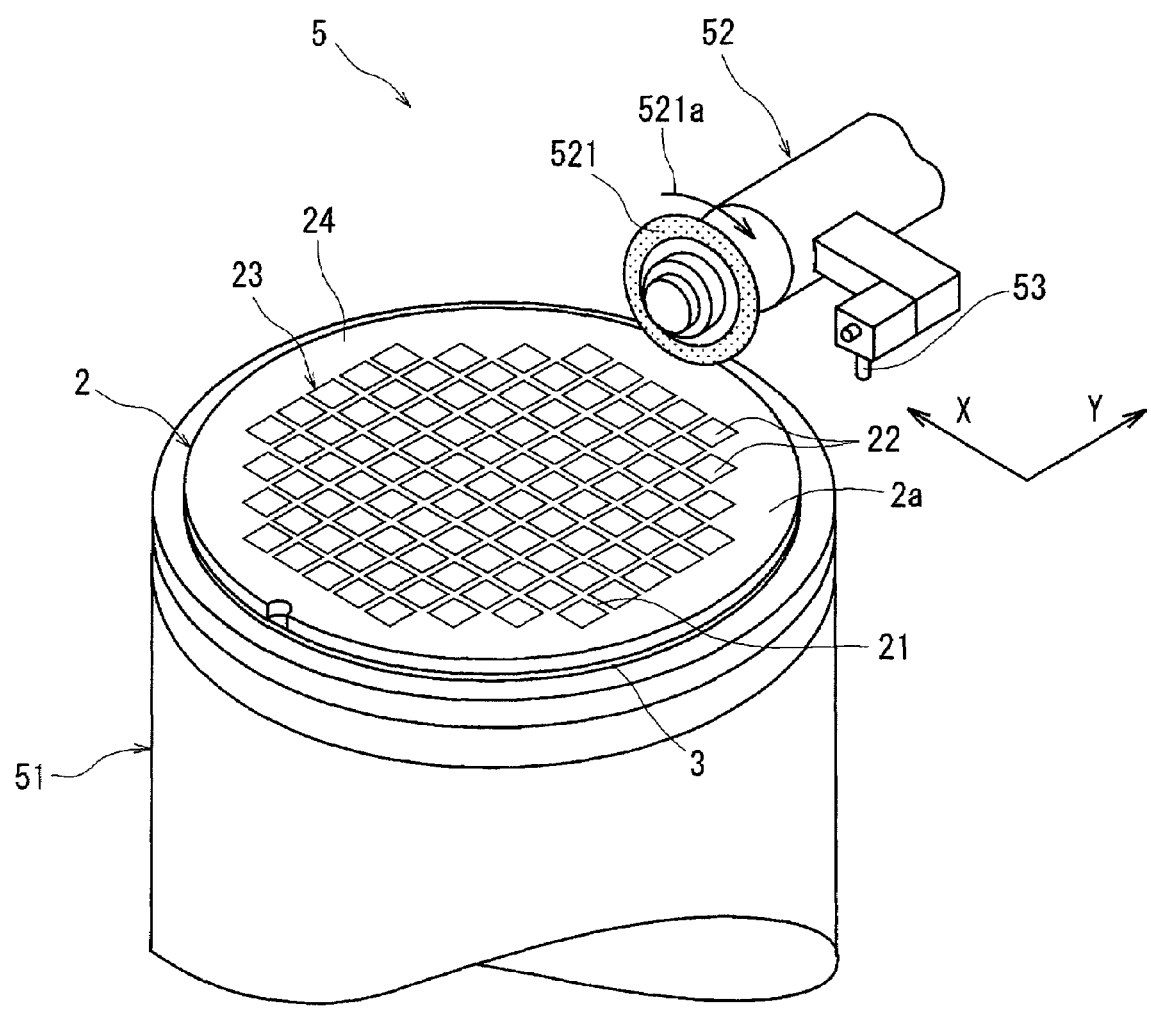
FIG. 6 is a perspective view of a cutting device used to cut an outer circumferential redundant area of the semiconductor wafer shown in FIG. 1.

To laminate the reinforced wafer 20 described above, an underlying wafer is prepared as below. The underlying wafer has a diameter slightly smaller than the inside diameter of the annular reinforced portion 24b and is formed on the front surface thereof with a plurality of streets and of devices identical to the plurality of streets 21 and of devices 22, respectively, formed in the device area 23 of the reinforced wafer 20. The underlying wafer can be formed by cutting the outer circumferential redundant area 24 of the semiconductor wafer 2 shown in FIG. 1 described above. Cutting the outer circumferential redundant area 24 of the semiconductor wafer 2 is executed by use of a cutting device 5 shown in FIG. 6. The cutting device 5 shown in FIG. 6 includes a chuck table 51 provided with suction-holding means; cutting means 52 provided with a cutting blade 521; and imaging means 53. To cut the outer circumferential redundant area 24 of the semiconductor wafer 2 by use of the cutting device 5, an alignment step is executed as below. After the protection member 3 is affixed to the rear surface of the semiconductor wafer 2 as shown in FIG. 6, the semiconductor wafer 2 is placed on the chuck table 51 with the protection member 3 facing the chuck table 51. The semiconductor wafer 2 is positioned immediately below the imaging means 53 as shown in FIG. 6. Then, a to-be-cut area of the semiconductor wafer 2 is detected by the imaging means 53 and control means not shown. In other word, the imaging means 53 and control means not shown execute alignment work for positioning between the cutting blade 521 and the border portion between the device area 23 and outer circumferential redundant area 24 of the semiconductor wafer 2.

Figure 7A:
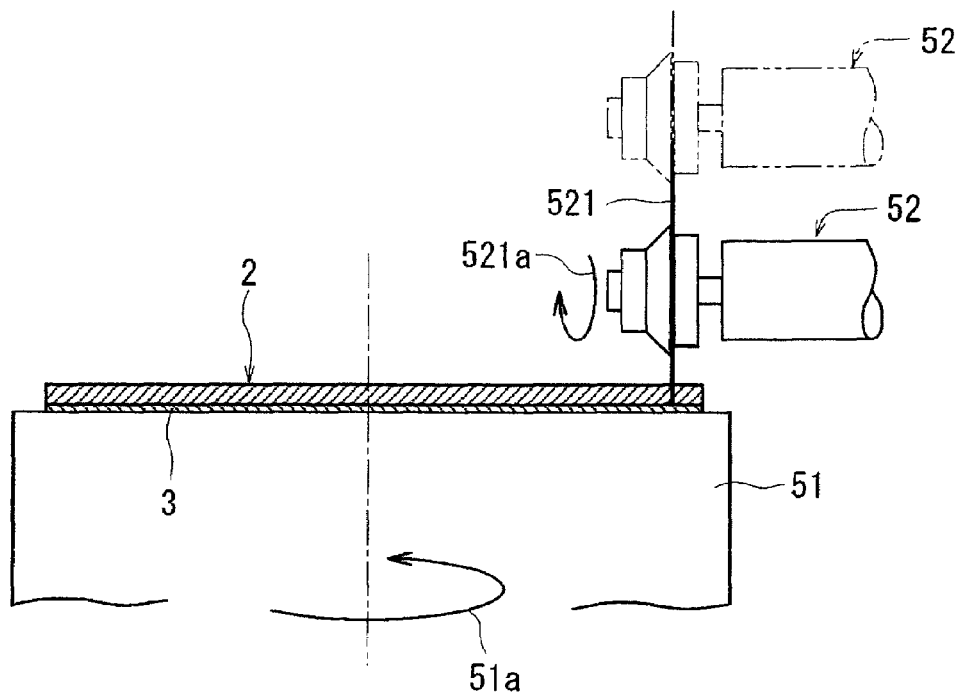
FIGS. 7A and 7B are diagrams for assistance in explaining an outer circumferential redundant cutting step for cutting the outer circumferential redundant area of the semiconductor wafer by use of the grinding device shown in FIG. 6.

The alignment to detect the to-be-cut area of the semiconductor wafer 2 held on the chuck table 51 is executed as described above. Thereafter, the chuck table 51 holding the semiconductor wafer 2 is moved to a cut area. The cutting blade 521 of the cutting means 52 is positioned immediately above the border portion between the device area 23 and outer circumferential redundant area 24 of the semiconductor wafer 2 held on the chuck table 51. As shown in FIG. 7A, while rotated in the direction indicated with arrow 521a, the cutting blade 521 is incision-transferred downward from the standby position indicated with a two-dot chain line and positioned at a predetermined incision-transfer position as shown with a solid line. This incision-transfer position is set at a position where the outer circumferential edge of the grinding blade 521 reaches the protection member 3.

Figure 7B:
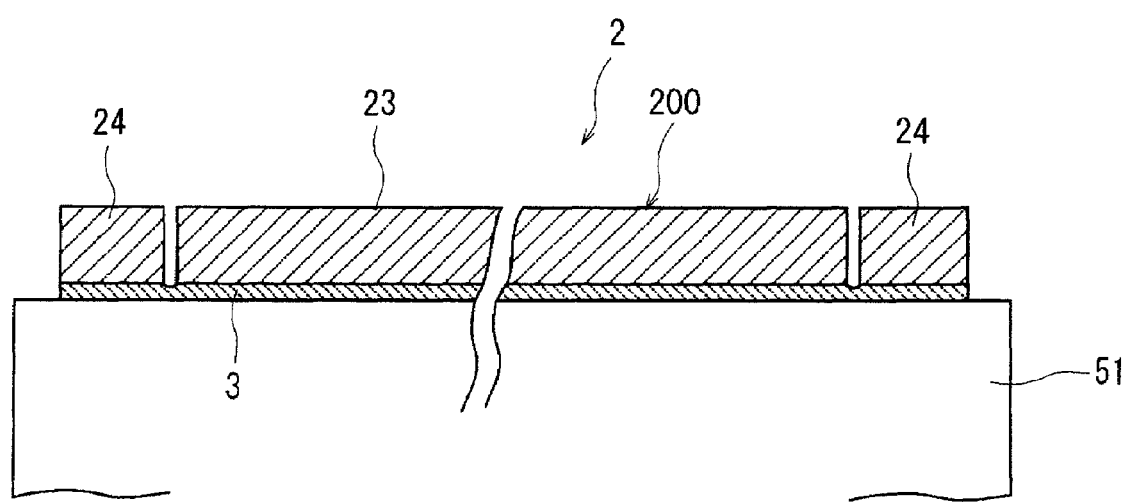

Next, as described above, while rotating the cutting blade 521 in the direction indicated with arrow 521a, the chuck table 51 is rotated in the direction indicated with arrow 51a in FIG. 7A. If the chuck table is rotated once, the semiconductor wafer 2 is cut along the border portion between the device area 23 and the outer circumferential redundant area 24 as shown in FIG. 7B (the outer circumferential redundant area cutting step). The underlying wafer 200 in which the border portion between the device area 23 and outer circumferential redundant area 24 of the semiconductor wafer 2 was cut to remove the outer circumferential redundant area 24 as described above is set to have a diameter of 195 mm in the illustrated embodiment.

Figure 8A:
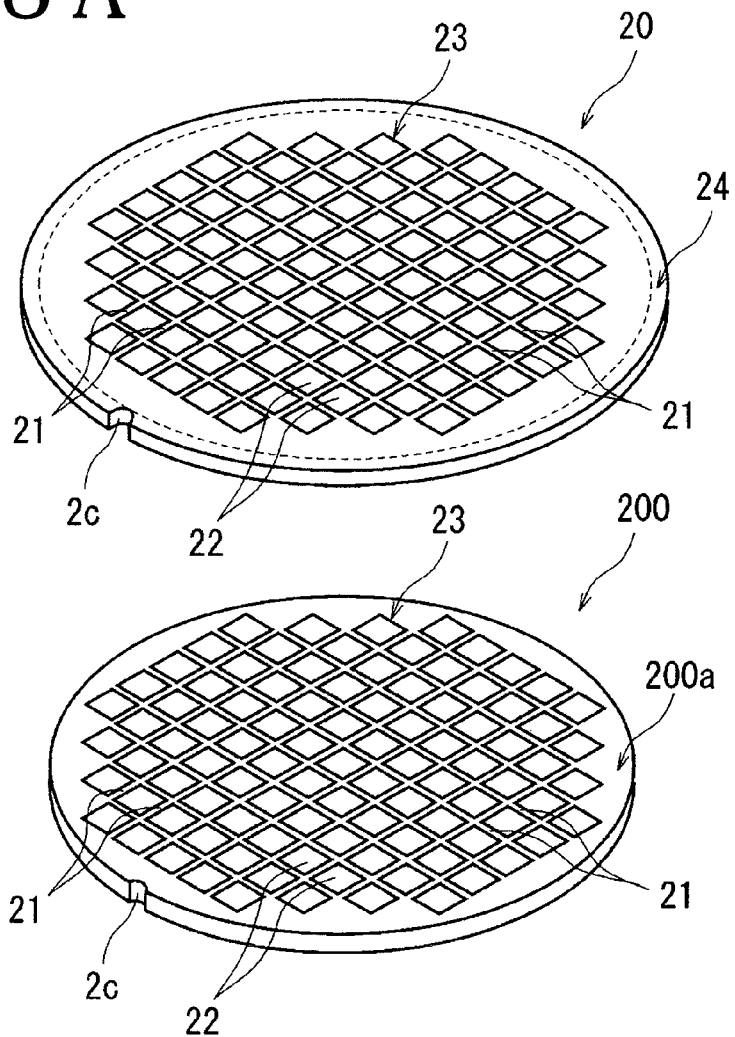
FIGS. 8A and 8B are diagrams for assistance in explaining a wafer lamination step in the lamination device manufacturing method according to the present invention.
Figure 8B:
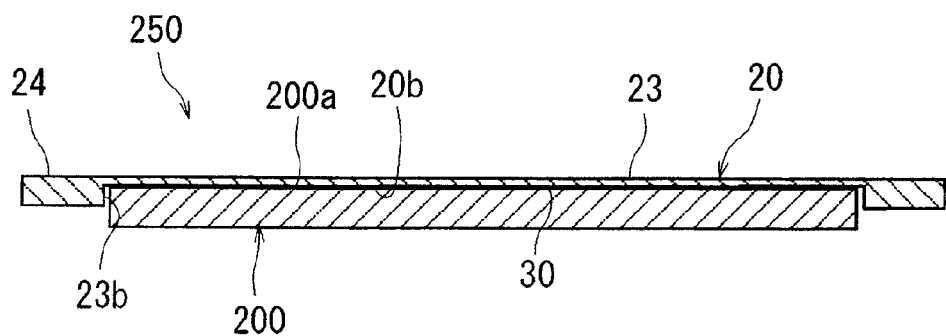

After the reinforced wafer 20 and the underlying wafer 200 are prepared as described above, a wafer lamination step is executed as below. As shown in FIGS. 8A and 8B, the rear surface 20b of the reinforced wafer 20 corresponding to the device area 23 is faced to and joined to the front surface 200a of the underlying wafer 200 with their corresponding streets 21 aligned with each other. Thus, a lamination wafer is formed. More specifically, as shown in FIG. 8B, the circular recessed portion 23b formed in the rear surface of the reinforced wafer 20 is fitted to the underlying wafer 200. The front surface 200a of the underlying wafer 200 is bonded with an adhesion bond 30 to the rear surface 20b of the reinforced wafer 20 corresponding to the device area 23 to thereby form the lamination wafer 250. In this case, the reinforced wafer 20 can be laminated on the underlying wafer 200 with their directions aligned with each other by slightly leaving the notches 2c indicating the directions in the wafer 200. Incidentally, it is desirable to use a low-dielectric constant polymer agent such as a benzocyclobutene or the like, as the adhesive bond 30.

After the lamination wafer 250 is formed by executing the wafer lamination step described above, an electrode connection step is executed as below. Via-holes formed in the reinforced wafer 20 constituting part of the lamination wafer 250 are each formed at a position where an electrode 25 is formed in each of the devices 22 thereof, so as to reach a corresponding electrode 25 formed in each of the devices 22 of the underlying wafer 200. The via-hole is filled with a conductive material to connect the electrodes corresponding to each other. In the electrode connection step, a via-hole forming step is executed as below. At first, the via-holes formed in the reinforced wafer 20 constituting part of the lamination wafer 250 are each formed at a position where an electrode 25 is formed in each of the devices 22 thereof, so as to reach a corresponding electrode 25 formed in each of the devices 22 thereof. This via-hole forming step is executed by use of a laser processing device shown in FIG. 9 in the illustrated embodiment. The laser processing device 6 shown in FIG. 9 includes a chuck table 61 adapted to hold a workpiece; and laser beam irradiation means 62 for directing a laser beam to the workpiece held on the chuck table 61. The chuck table 61 is configured to suck and hold the workpiece. The chuck table 61 is moved in a processing-transfer direction indicated with arrow X shown in FIG. 9 by a processing-transfer mechanism not shown. In addition, the chuck table 61 is moved in an indexing-transfer direction indicated with arrow Y by an indexing-transfer mechanism not shown.

The laser beam irradiation means 62 emits a pulse laser beam from a collector 622 attached to the leading end of a cylindrical casing 621 disposed substantially horizontally. The laser processing device 6 is equipped with imaging means 63 attached to the leading end of the casing 621 constituting part of the laser beam irradiation means 62. This imaging means 63 includes illumination means for illuminating a workpiece; an optical system for capturing an area illuminated by the illumination means; and an imaging element (CCD) or the like for picking up an image captured by the optical system. The imaging means 63 routes a signal of an image picked up, to control means not shown.

Figure 9:
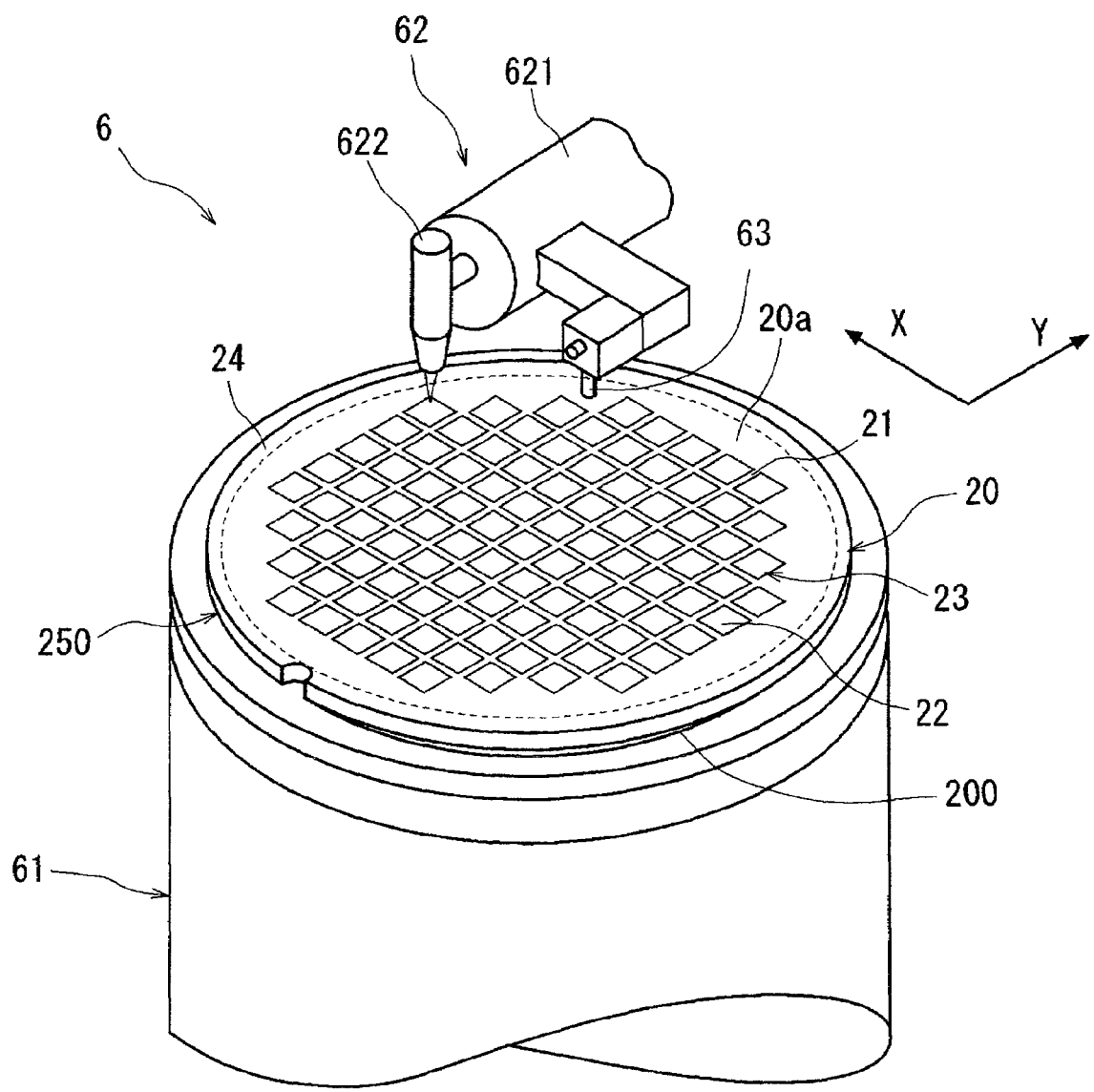
FIG. 9 is a perspective view of a laser machining device used to execute a via-hole forming step in an electrode connection step of the lamination device manufacturing method according to the present invention.

A description is hereinafter given of the via-hole forming step executed by use of the laser processing device 6 shown in FIG. 9. At first, the lamination wafer 250 is placed on the chuck table 61 of the laser processing device 6 with the underlying wafer 200 facing the chuck table 61 and sucked and held onto the chuck table 61. Accordingly, the lamination wafer 250 is held with the front surface 20a of the reinforced wafer 20 facing upside.

The chuck table 61 sucking and holding the lamination wafer 250 as described above is positioned immediately below the imaging means 63 by a processing-transfer mechanism not shown. Next, alignment work is executed in which determination is made as to whether or not the lattice-like streets 21 formed on the reinforced wafer 20 constituting part of the lamination wafer 250 are disposed parallel to X- and Y-directions. More specifically, the alignment work is executed as below. The reinforced wafer 20 constituting part of the lamination wafer 250 held on the chuck table 61 is imaged by the imaging means 63 and imaging processing such as pattern matching and the like are executed. If the streets 21 are not arranged parallel to the X- and Y-directions, the chuck table 61 is turned to adjust the streets 21 parallel to the X- and Y-directions. The alignment work is executed as described above to position the lamination wafer 250 on the chuck table 61 at predetermined coordinate positions.

Figure 10A:
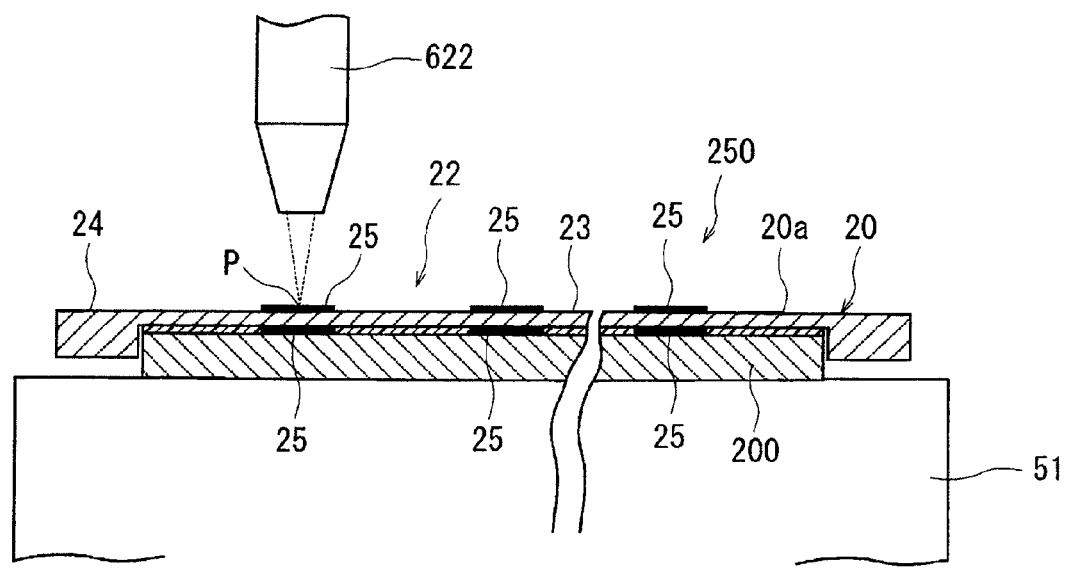
FIGS. 10A and 10B are diagrams for assistance in explaining the via-hole forming step of the electrode connection step in the lamination device manufacturing method according to the present invention.
Figure 10B:
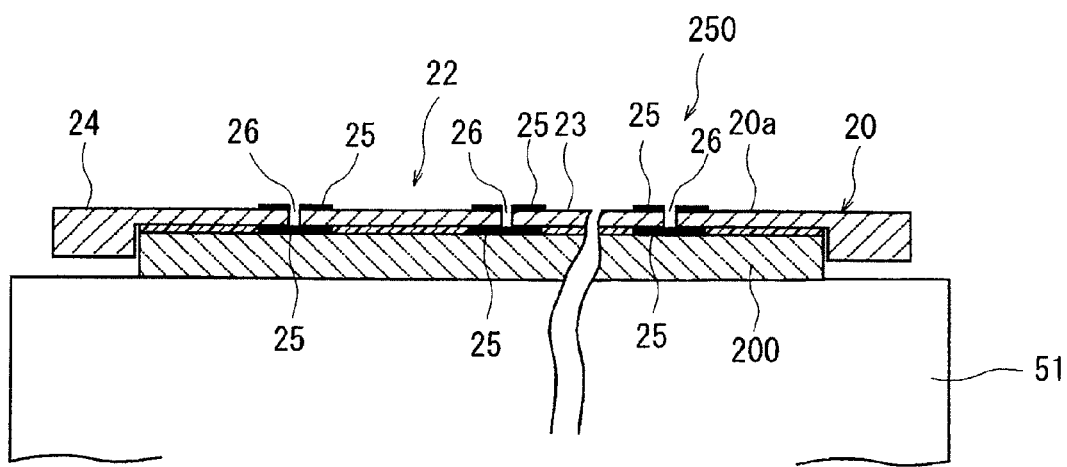

Next, the chuck table 61 is moved to locate a predetermined electrode 25 (a leftmost electrode in FIG. 10A) provided in a predetermined device 22 (a leftmost electrode in FIG. 10A) formed in the reinforced wafer 20 constituting part of the lamination wafer 250 as shown in FIG. 10A, at a position immediately below the collector 622 of the laser beam irradiation means 62. The laser beam irradiation means 62 is operated to allow the collector 622 to direct to the reinforced wafer 20 a pulse laser beam with a wavelength (e.g. 355 nm) capable of being absorbed by a silicon wafer. In this case, a focused point P of the pulse laser beam emitted from the collector 622 is allowed to coincide with a position close to the front surface 20a of the reinforced wafer 20 constituting part of the lamination wafer 250. In this way, as shown in FIG. 10B, by irradiation of the pulse laser beam with a predetermined pulse, the reinforced wafer 20 is formed with a via-hole 26 that is located at the electrode 25 and that reaches the electrode 25 formed in the underlying wafer 200 (the via-hole forming step). Incidentally, the number of pulses of the pulse laser beam emitted in the via-hole forming step is empirically determined according to the output power of the pulse laser beam and to the thickness of the device area 23. The via-hole forming step described above is executed on a position where the electrode 25 is located on each of the devices 22 formed on the reinforced wafer 20.

Figure 11A:
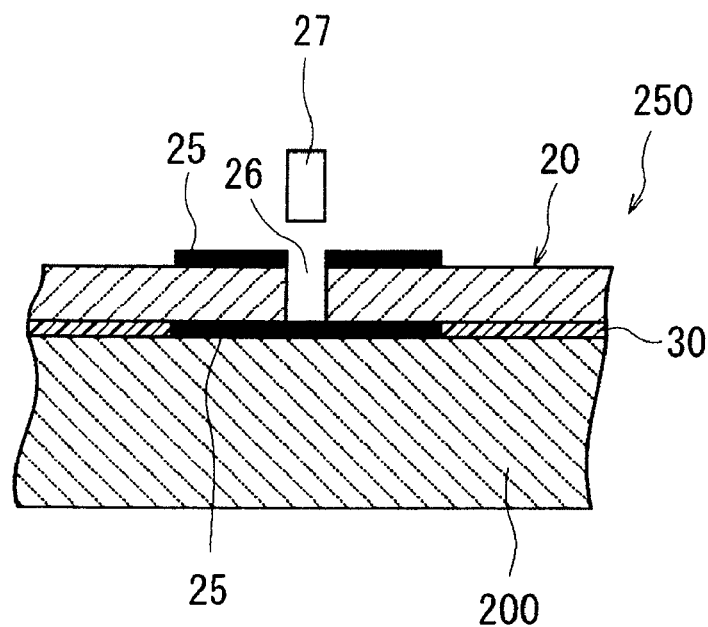
FIGS. 11A and 11B are diagrams for assistance in explaining a conductive material burying step in the electrode connection step of the lamination device manufacturing method according to the present invention.
Figure 11B:
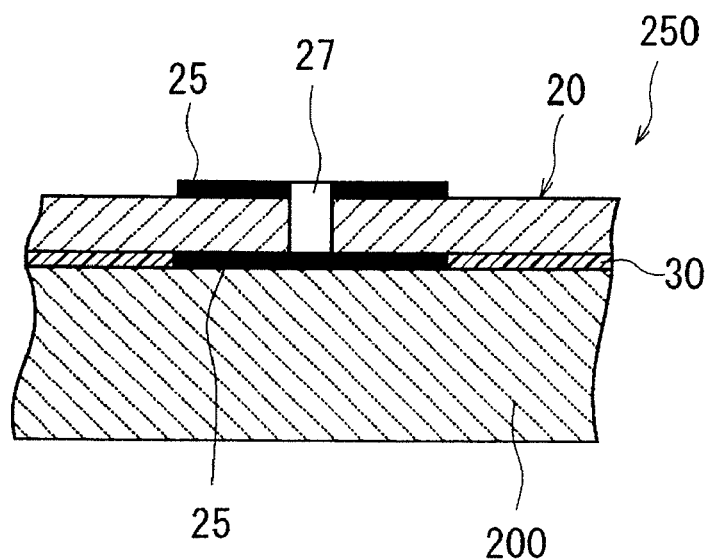

After the via-hole forming step is executed as described above, a conductor material burying step for filling the via-hole 26 with a conductive material and connecting electrodes. As shown in FIGS. 11A and 11B, in the conductive material burying step, the via-hole 26 formed in the reinforced wafer 20 constituting part of the lamination wafer 250 is filled with the conductive material 27 such as copper or the like to connect the electrode 25 formed on the underlying wafer 200 with the electrode 25 formed on the reinforced wafer 20.

Figure 12A:
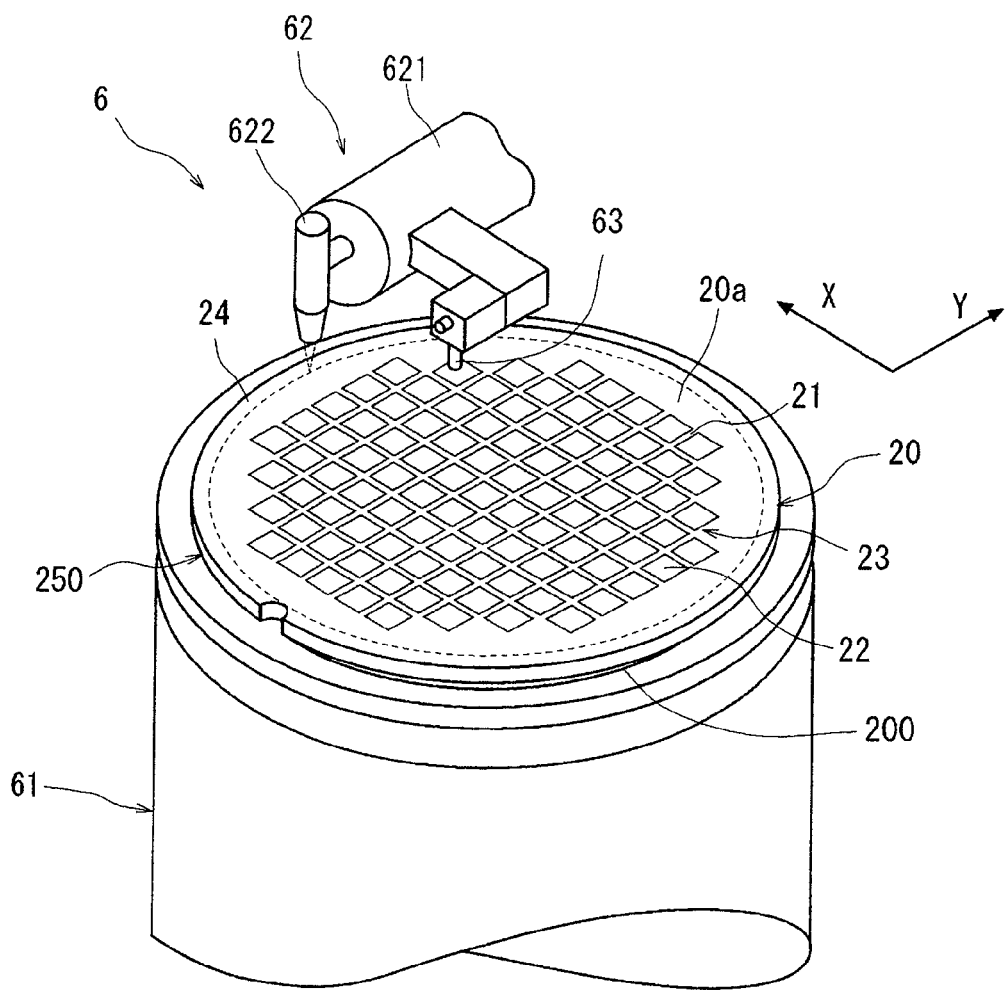
FIGS. 12A and 12B are diagrams for assistance in explaining an annular reinforced portion removing step in the lamination device manufacturing method according to the present invention.

After the electrode connecting step composed of the via-hole forming step and the conductive material burying step is executed as described above, a division step described later may be executed. However, an annular reinforced portion removing step is further executed as below. To laminate the reinforced wafer 20, an annular reinforced portion 24b is removed to allow the reinforced wafer 20 constituting part of the lamination wafer 250 to have a diameter slightly smaller than the inside diameter of the annular reinforced portion 24b. Although the annular reinforcing portion removing step may be executed by use of the cutting device 5 shown in FIG. 6, it is executed by use of the laser processing device 6 shown in FIG. 9 in the illustrated embodiment. More specifically, as shown in FIG. 12A, the lamination wafer 250 is placed on the chuck table 61 of the laser processing device 6 with the underlying wafer 200 of the lamination wafer 250 facing the chuck table 61 and sucked and held on the chuck table 61. Thus, the lamination wafer 250 is held with the front surface 20a of the reinforced wafer 20 facing the upside.

Figure 12B:
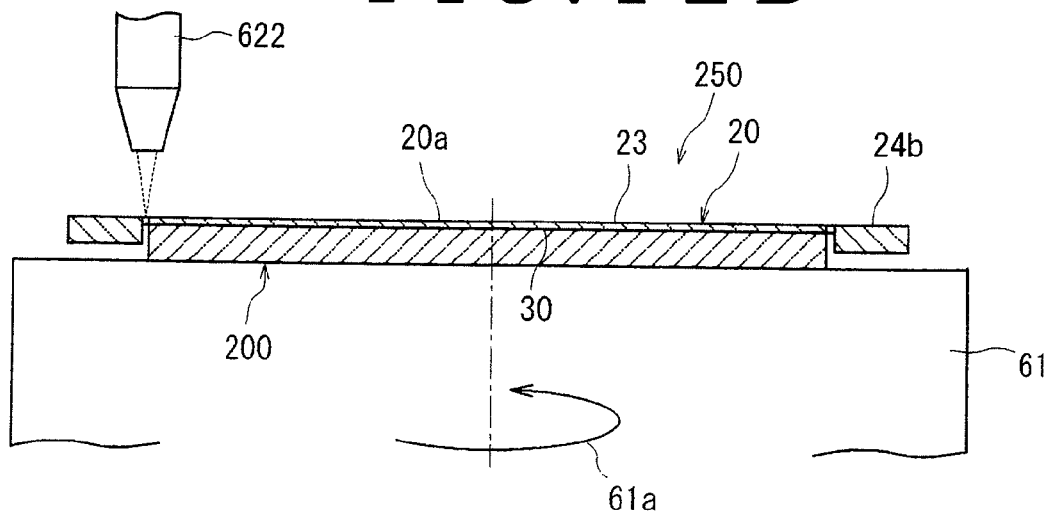

As shown in FIGS. 12A and 12B, the reinforced wafer 20 is positioned so that a position slightly (e.g. 1 mm) inside of the inner surface of the annular reinforced portion 24b formed in the reinforced wafer 20 may be immediately below the collector 622 of the laser beam irradiation means 62. Then, while the laser beam irradiation means 62 is operated as shown in FIG. 12B to allow the collector 622 to emit a pulse laser beam with a wavelength (e.g. 355 nm) capable of being absorbed by a silicon wafer, the chuck table 61 is rotated. In this case, the focused point P of the pulse laser beam emitted from the collector 622 is allowed to coincide with a position close to the front surface 20a of the reinforced wafer 20 constituting part of the lamination wafer 250. As a result, if the chuck table 61 is rotated once, the annular reinforced portion 24b of the reinforced wafer 20 is cut as shown in FIG. 12B. Accordingly, the outside diameter of the reinforced wafer 20 becomes substantially equal to that of the underlying wafer 200.

Figure 13A:
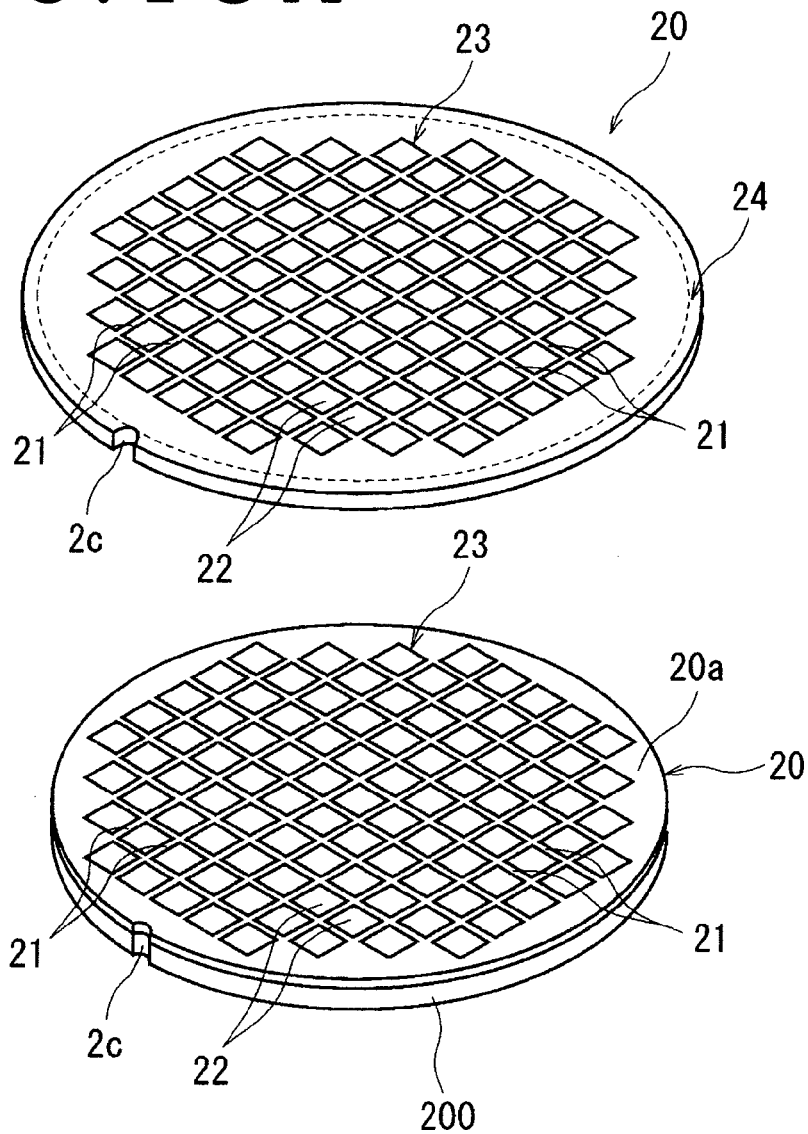
FIGS. 13A and 13B are diagrams for assistance in explaining a second wafer lamination step in the lamination device manufacturing method according to the present invention.
Figure 13B:
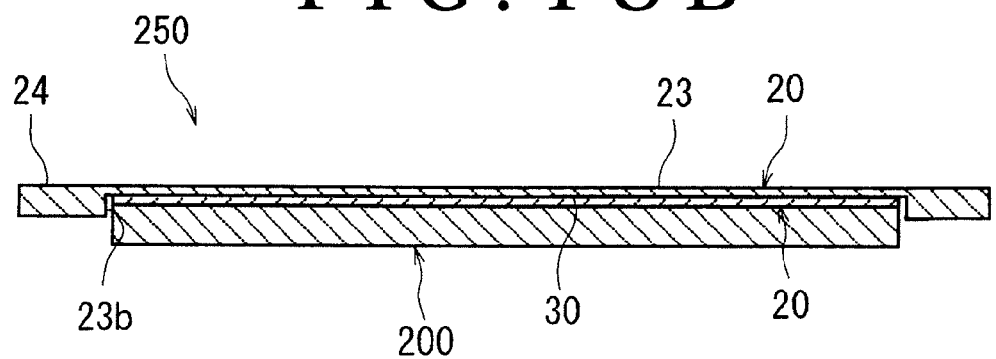

After the annular reinforced portion removing step is executed, as shown in FIGS. 13A and 13B, a second wafer lamination step is executed as below. A rear surface, of a reinforced wafer 20 to be next laminated, corresponding to the device area 23 is faced to and joined to the front surface 20a of the reinforced wafer 20 of the lamination wafer 250 with their corresponding streets aligned to each other. The second wafer lamination step is substantially the same as the wafer lamination step shown in FIG. 8.

After the second wafer lamination step is executed, a second electrode connection step is executed as below. Via-holes formed in the reinforced wafer 20 laminated on the upside to constitute part of the lamination wafer 250 are each formed at a position where an electrode 25 is formed in each of the devices 22 thereof, so as to reach a corresponding electrode 25 formed in each of the devices 22 of the lower side reinforced wafer 20. Then, the via-holes are filled with a conductive material to connect the corresponding electrodes. The second electrode connection step is substantially the same as the via-hole forming step shown in FIGS. 10A and 10B and the conductive material burying step shown in FIGS. 11A and 11B.

After the second electrode connection step is executed, an annular reinforced portion removing step shown in FIGS. 12A and 12B is executed. The second wafer lamination step, the second electrode connection step, and the annular reinforced portion removing step are repeatedly executed until the preset number of the reinforced wafers 20 is laminated. Thus, a multi-layered lamination wafer is formed.

Figure 14A:
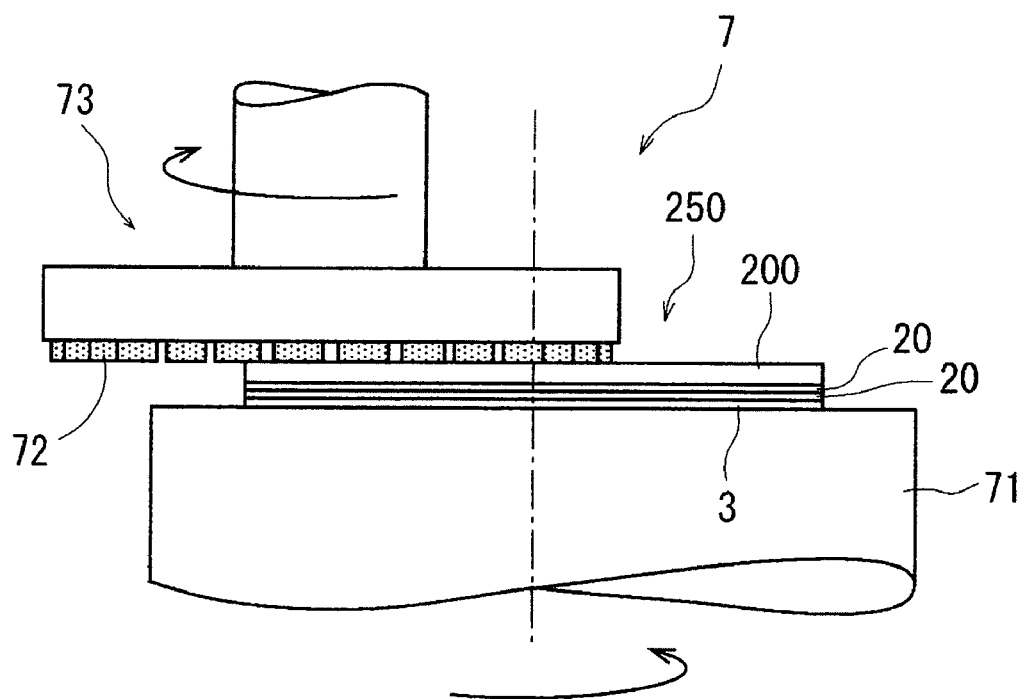
FIGS. 14A and 14B are diagrams for assistance in explaining an underlying wafer grinding step according to the lamination device manufacturing method according to the present invention.
Figure 14B:
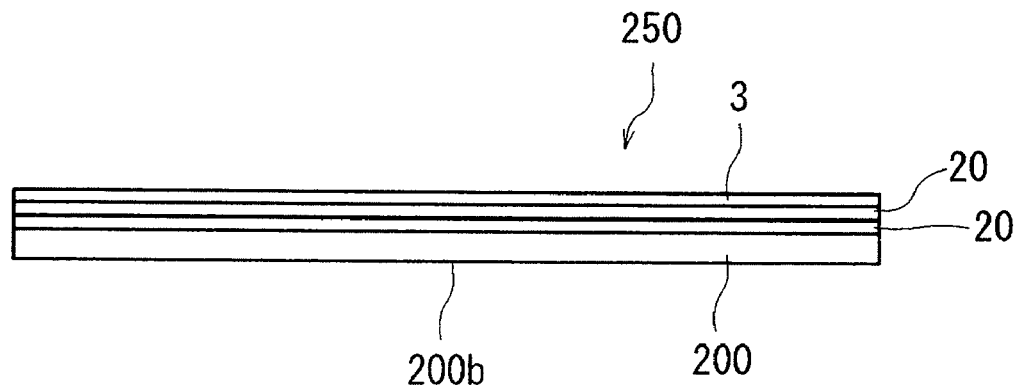

Next, an underlying wafer grinding step is executed in which the rear surface 200b of the underlying wafer 200 constituting part of the lamination wafer 250 is ground so that the underlying wafer 200 may have a predetermined thickness. The underlying wafer grinding step is executed by use of a grinding device shown in FIG. 14A. The grinding device 7 shown in FIG. 14A includes a chuck table 71 adapted to hold a workpiece; and grinding means 73 provided with a grinding stone 72 adapted to grind the workpiece held on the chuck table 71. To execute the underlying wafer grinding step by use of the grinding device 7 configured described above, a protection member 3 is affixed to the front surface of the upper reinforced wafer 20 constituting part of the lamination wafer 250 as shown in FIG. 14B. Thereafter, the lamination wafer 250 is placed on the chuck table 71 with the protection member 3 facing the chuck table 71 and sucked and held onto the chuck table 71 as shown in FIG. 14A. Thus, the lamination wafer 250 is such that the rear surface 200b of the underlying wafer 200 faces the upside. After the lamination wafer 250 is held on the chuck table 71 as described above, while the chuck table 71 is rotated at e.g. 300 rpm, the grinding stone 72 of the grinding mean 73 is rotated at e.g. 6000 rpm and brought into contact with the rear surface 200b of the underlying wafer 200 to grind it. In this way, the underlying wafer 200 is formed to have a thickness of e.g. 60 μm.

Figure 15:
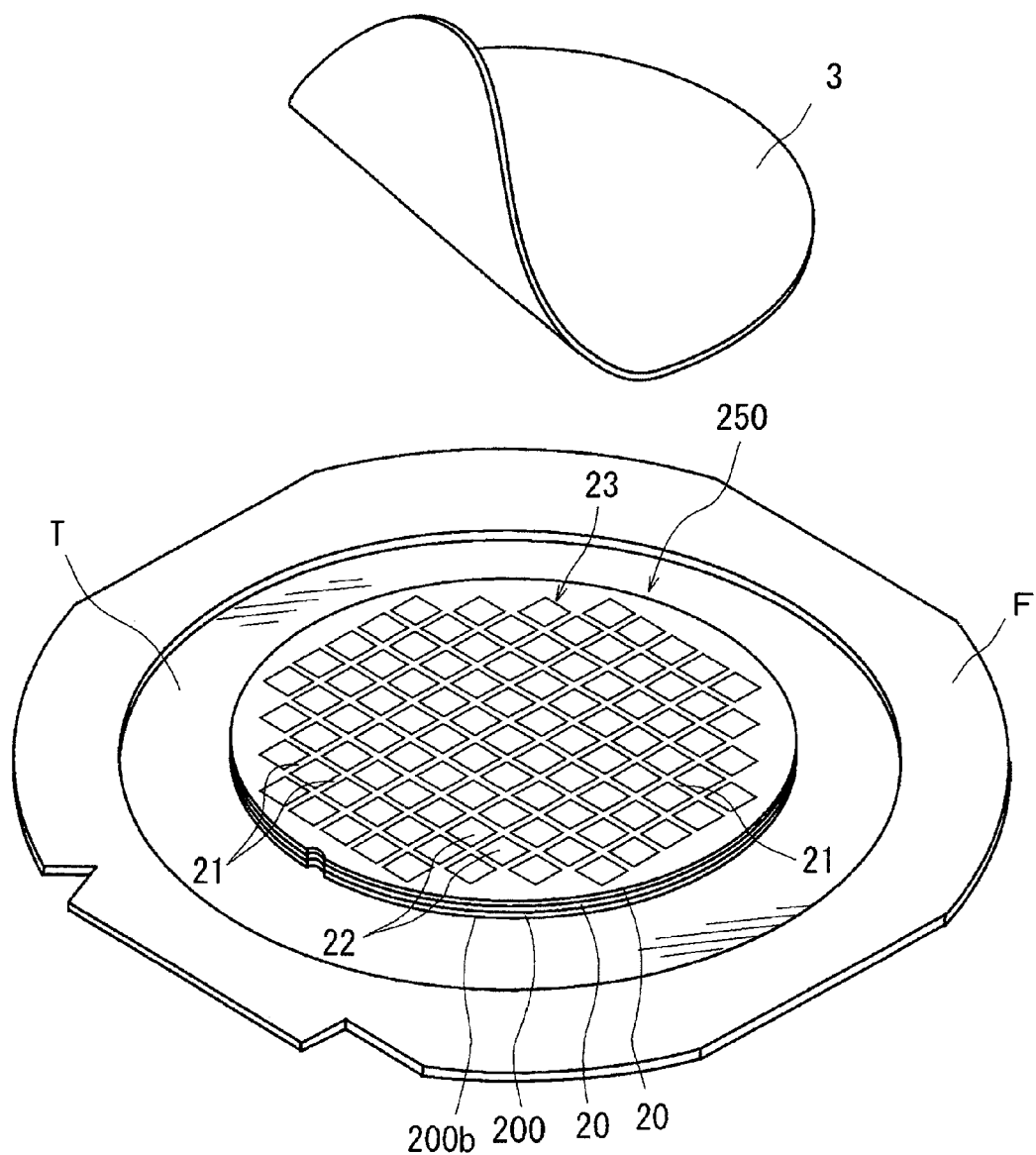
FIG. 15 is a diagram for assistance in explaining a wafer support step and a protection member peeling step in the lamination device manufacturing method according to the present invention.

After the underlying wafer grinding step described above is executed, a division step is executed in which the lamination wafer 250 is cut along the streets, i.e., is divided into individual lamination devices. Before the division step is executed, a wafer support step is executed in which the rear surface 200b of the underlying wafer 200 constituting part of the lamination wafer 250 is affixed to the front surface of a dicing tape T attached to an annular frame F as shown in FIG. 15. Then, the protection member 3 affixed to the front surface of the upper reinforced wafer 20 constituting part of the lamination wafer 250 is peeled therefrom (the protection member peeling step).

Figure 16:
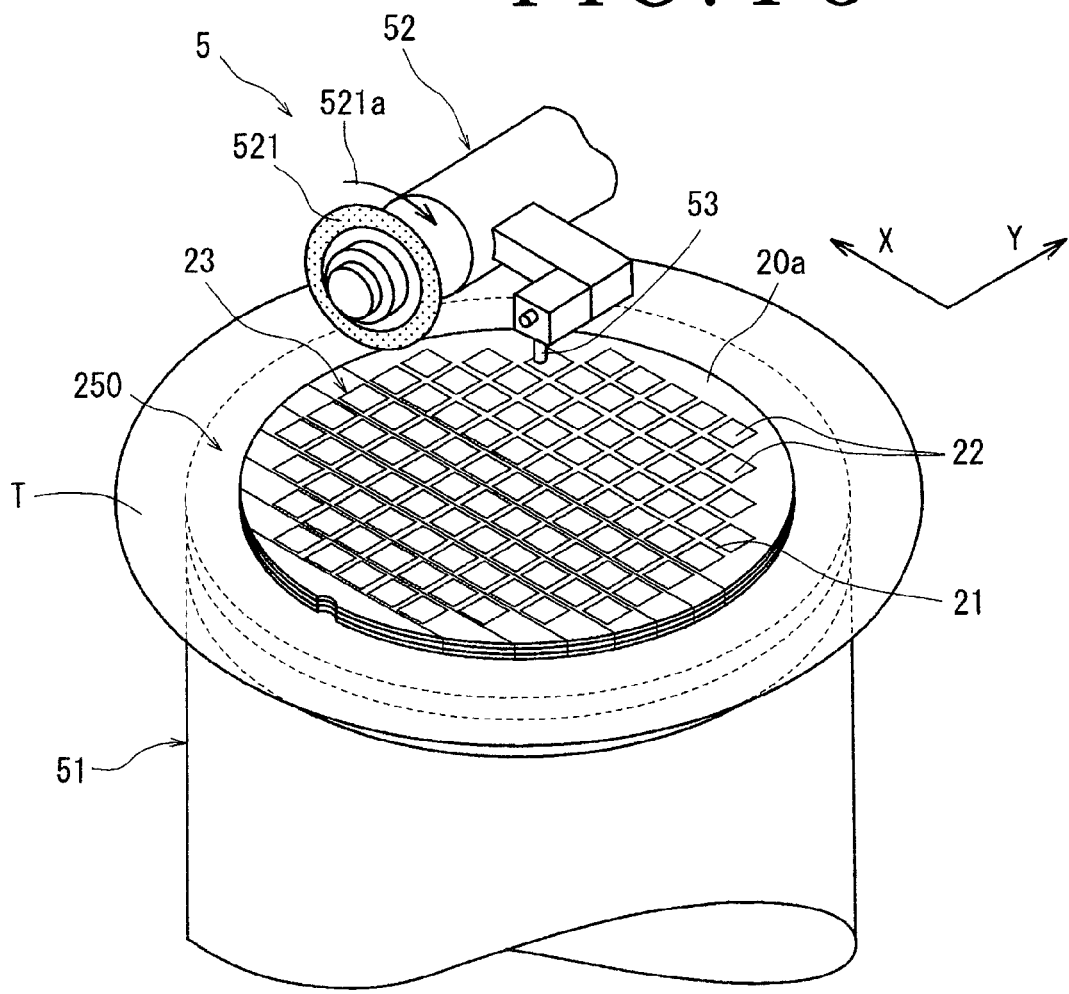
FIG. 16 is a diagram for assistance in explaining a division step in the lamination device manufacturing method according to the present invention.

After the wafer support step and the protection member peeling step are executed as described above, the division step described above is executed by use of the cutting device 5 shown in FIG. 6. More specifically, the dicing tape T affixed with the lamination wafer 250 in the wafer support step described above is placed on the chuck table 51 of the cutting device 5 as shown in FIG. 16. Then, suction means not shown is operated to hold the lamination wafer 250 onto the chuck table 51 via the dicing table T. Thus, the lamination wafer 250 held on the chuck table 51 is such that the front surface 20a of the upper reinforced wafer 20 faces the upside. Incidentally, although the annular frame F attached with the dicing tape T is omitted in FIG. 16, the annular frame F is held by appropriate frame holding means attached to the chuck table 51. The chuck table 51 that sucks and holds the lamination wafer 250 as described above is positioned immediately below imaging means 53 by a cutting-transfer mechanism not shown.

After the chuck table 51 is positioned immediately below the imaging means 53, an alignment step is executed in which the imaging means 53 and control means not shown detect a to-be-cut area of the lamination wafer 250. More specifically, the imaging means 53 and the control means not shown performs positioning between the cutting blade 521 and each of the streets 21 formed on the reinforced wafer 20 constituting part of the lamination wafer 250.

The street 21 formed on the reinforced wafer 20 constituting part of the lamination wafer 250 held on the chuck table 51 as described above is detected for alignment of a to-be-cut area. Thereafter, the chuck table 51 holding the lamination wafer 250 is moved to a cut-start position of the to-be-cut area so that a predetermined street 21 may be aligned with the cutting blade 521. While being rotated in the direction indicated with arrow 521a in FIG. 16, the cutting blade 521 is moved downward to execute incision-transfer by a predetermined amount. The incision-transfer position is set to a position where the outer circumferential edge of the cutting blade 521 reaches the dicing tape T. After the incision-transfer of the cutting blade 521 is executed in this way, while the cutting blade 521 is rotated at a rotation rate of e.g. 40000 rpm, the chuck table 51 is cutting-transferred in the direction indicated with arrow X in FIG. 16 at a cutting-transfer rate of e.g. 50 mm/sec. As a result, the lamination wafer 250 is cut along a predetermined street 21 (the cutting step).

Figure 17:
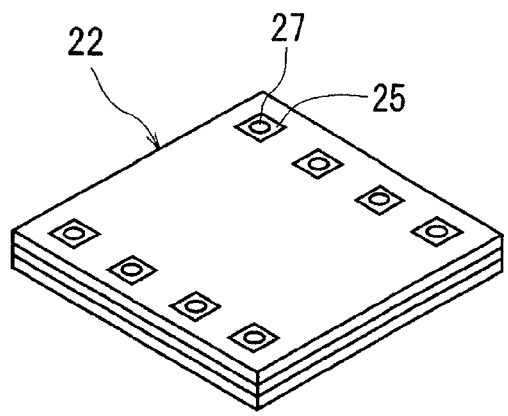
FIG. 17 is a perspective view of a lamination device manufactured by the lamination device manufacturing method according to the present invention.

The cutting step is executed along all the streets 21 of the lamination wafer 250 extending in the predetermined directions as described above. Thereafter, the chuck table 51 is turned by 90 degrees and the cutting step is executed along the streets 21 extending in the direction perpendicular to the predetermined direction of the lamination wafer 250. Thus, the lamination wafer 250 is divided into individual lamination devices. Incidentally, the lamination devices are not disassembled by the operation of the dicing tape T, i.e., are maintained in a wafer state in which the lamination devices are supported by the annular frame F via the dicing tape T. The lamination devices divided as described above are each peeled from the dicing tape T in a pickup step, a subsequent step, to become a lamination device 220 as shown in FIG. 17.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A lamination device manufacturing method for manufacturing a lamination device using a reinforced wafer, in which the reinforced wafer is sectioned into a plurality of areas by streets arranged on a front surface in a lattice pattern and includes a device area formed with devices in the areas thus sectioned and an outer circumferential redundant area surrounding the device area, an area of an rear surface corresponding to the device area is ground so that the device area may be formed to have a predetermined thickness and an area corresponding to the outer circumferential redundant area may be left to form an annular reinforced portion, the method comprising:

a wafer lamination step in which an underlying wafer having a diameter slightly smaller than an inside diameter of the annular reinforced portion of the reinforced wafer and formed on a front surface with a plurality of streets and of devices corresponding respectively to a plurality of streets and of devices formed in the device area of the reinforced wafer is prepared, and a rear surface of the reinforced wafer corresponding to the device area is faced to and joined to the front surface of the underlying wafer with corresponding streets aligned with each other, thus forming a lamination wafer;

an electrode connection step in which a via-hole is formed at a position where an electrode is formed in each of the devices of the reinforced wafer constituting part of the lamination wafer, so as to reach a corresponding electrode formed in each of the devices of the underlying wafer, and the via-hole is filled with a conductive material to connect the electrodes; and a division step in which after the electrode connection step is executed, the lamination wafer is cut along the streets and divided into individual lamination devices.

2. The lamination device manufacturing method according to claim 1, further comprising before the execution of the division step:

an annular reinforced portion removing step in which the annular reinforced portion is removed so that the reinforced wafer constituting part of the lamination wafer may have a diameter slightly smaller than the inside diameter of the annular reinforced portion;

a second wafer lamination step in which a rear surface, of a reinforced wafer to be next laminated, corresponding to a device area is faced to and joined to the front surface of the reinforced wafer of the lamination wafer subjected to the annular reinforced portion removing step with corresponding streets aligned with each other; and a second electrode connection step in which a via-hole is formed at a position where an electrode formed in each of devices of the upper reinforced wafer laminated by the second wafer lamination step, so as to reach a corresponding electrode formed in each of devices of the lower reinforced wafer, and is filled with a conductive material for connecting the electrodes.

3. The lamination device manufacturing method according to claim 2, wherein the annular reinforced portion removing step, the second wafer lamination step and the second electrode connection step are repeatedly executed to form a multi-layered lamination wafer.

4. The lamination device manufacturing method according to claim 1, wherein before execution of the division step, an underlying wafer grinding step is executed in which an underlying wafer is ground from a rear surface to be formed to have a predetermined thickness.

* * * * *